United States Patent [19]

Kumada

[11] Patent Number: 5,146,302
[45] Date of Patent: Sep. 8, 1992

[54] CHARGE SKIMMING SOLID-STATE IMAGING DEVICE INCLUDING SAMPLING CIRCUITS

[75] Inventor: Norimasa Kumada, Itami, Japan

[73] Assignee: Mitsubishi Denki Kabushiki Kaisha, Japan

[21] Appl. No.: 695,344

[22] Filed: May 3, 1991

[30] Foreign Application Priority Data

Nov. 5, 1990 [JP] Japan .................................. 2-301280

[51] Int. Cl.$^5$ ..................... H01L 29/78; H01L 27/14; H01L 31/00
[52] U.S. Cl. ....................................... 357/24; 357/30; 377/60
[58] Field of Search ................ 357/24 LR, 30; 377/60

[56] References Cited

U.S. PATENT DOCUMENTS 5,003,565  3/1991  Yoshida .......................... 357/24 LR

FOREIGN PATENT DOCUMENTS 2151183  6/1990  Japan .

OTHER PUBLICATIONS

Chow et al., "Hybrid Infrared . . . Arrays", IEEE Transactions on Electron Devices, vol. ED-29, No. 1, 1982, pp. 3-15.

Primary Examiner—Rolf Hille
Assistant Examiner—Robert Limanek
Attorney, Agent, or Firm—Leydig, Voit & Mayer

[57] ABSTRACT

A solid-state imaging device utilizing a charge skimming transfer system includes a sampling circuit for each of a plurality of pixels for detecting a quantity of signal charge light-electricity converted by the respective pixels and outputs a voltage level in accordance therewith, and a charge input section for performing skimming transfer of the signal charge light-electricity converted by the respective pixels using the output voltage of said sampling circuit as a skimming voltage thereof.

6 Claims, 8 Drawing Sheets

CHARGE SKIMMING SOLID-STATE IMAGING DEVICE INCLUDING SAMPLING CIRCUITS

FIELD OF THE INVENTION

The present invention relates to a solid-state imaging device such as an infrared imaging device and, more particularly, to an imaging device employing a charge skimming technique.

BACKGROUND OF THE INVENTION

FIG. 5 shows a perspective view of a prior art infrared imaging device. In FIG. 5, a two-dimensional array of photodiodes 1 comprising such as 128×128 pixels is provided, which detects the infrared light 4 which is incident thereon and converts the light to electrical charges. A charge transfer device 2 is provided for successively transferring charges which are output from the two-dimensional array of photodiodes 1. In this case, this charge transfer device is constituted by a CCD (Charged-Coupled Device) which is produced on a silicon substrate. Indium bump electrodes 3 electrically connect the two-dimensional array of photodiodes 1 and the CCD 2.

FIGS. 6(a) to 6(c) schematically illustrate an operation of a charge input circuit of the CCD 2 of the infrared imaging device shown in FIG. 5. In FIG. 6, the same reference numerals as those shown in FIG. 5 designate the same or corresponding parts. An input gate electrode 5 is provided for controlling the input of the signal charge to the change input circuit of the CCD 2. A storage gate electrode 6 is provided for storing charges input to the charge input circuit. A transfer gate electrode 7 is provided for transferring the charges to the initial stage of the CCD 2. A driving electrode 8 is provided for driving the CCD 2. A skimming gate electrode 9 is provided for supplying a skimming voltage for establishing a skimming level in the potential well below the storage gate electrode 6. Reference numeral 11a designates stored charge remaining in the potential well not exceeding the skimming level. Reference numeral 11b designates stored charge in the potential well which has exceeded the skimming level. A charge exhaustion gate electrode 10 is provided for controlling the transfer of the stored charge 11a to the outside. Reference numeral 25 designates a charge exhaustion electrode.

A description is given of the operation hereinafter.

The two-dimensional array of photodiodes 1 and the CCD 2 are electrically connected by indium bumps 3 and a voltage different from the voltage applied to the storage gate electrode 6 is applied to the skimming gate electrode 9 thereby to produce a potential barrier in the charge storage section.

Here, when the infrared light 4 is incident on the two-dimensional array of photodiodes 1, the charges 11 produced by the photodiodes 1 flow into the input gate electrode 5 of CCD 2 via the indium bump 3 and are stored below the storage gate electrode 6 for a predetermined time (FIG. 6(a)). Thereafter, by changing the voltage applied to the transfer gate electrode 7, the stored charge 11b is transferred to below the CCD driving electrode 8 (FIG. 6(b)). At this time, a predetermined quantity of stored charge 11a which does not exceed a potential barrier remains without being transferred because of the potential barrier produced by the skimming gate electrode 9 at the storage gate electrode 6. Thereafter, by operating the exhaustion gate electrode 10, the stored charge 11a is exhausted to the charge exhaustion electrode 25 (FIG. 6(c)).

FIG. 7 shows a conceptional view in which a construction of the device is shown in a plane. Reference numeral 15 designates the charge input circuit of the CCD 2 shown in FIG. 6(a).

This method is described by Chow et al. in IEEE Transactions on Electron Devices, Volume ED-29, Number 1, January 1982, pages 13-4, and is called as "a charge skimming technique". This technique is effective when signal contrast is low as in the case of imaging infrared light.

FIG. 8 shows the content of the stored charged 11 in the imaging of infrared light of about 10 microns wavelength. Because the quantity of charge 13 generated by background radiation is much larger than the quantity of charge 12 generated by the signal light, the signal contrast is low. In the above described charge skimming technique, by giving an appropriate voltage to the skimming gate electrode 9, the skimming level 14 is determined as shown in FIGS. 9(a) and 9(b) thereby to remove the charge generated by the background radiation, and the charges 12 generated by the signal light are effectively transferred.

Therefore, an image of high signal contrast and high quality is obtained.

In the infrared imaging element utilizing above described prior art charge skimming technique, the skimming gate voltage has to be the same for all pixels. Furthermore, in a case where the skimming gate voltage is applied to respective pixels independently, the wiring of all of the 128×128 pixels has to be taken out to the outside. Such complex wiring is physically impossible.

The prior art solid-state imaging device utilizing the charge skimming transfer technique is constructed as described above and because the skimming gate voltage is the same for all pixels, when the sensitivity of the photodiodes is not uniform throughout all pixels as shown in FIG. 10(a), different pixels produce different charge quantities and the skimming gate voltage 14 has to be set in accordance with the pixel having the lowest sensitivity. As a result, charges produced at respective pixels is as shown in FIG. 10(b) after the skimming and it is impossible to effectively remove the d.c. component due to the background radiation from all pixels and therefore, it is impossible to perform an effective charge skimming transfer.

As a solution to this problem, a method of establishing a separate skimming gate voltage for each respective pixels is considered. However, in order to establish the skimming level separately for each pixels, the wirings of each of the 128×128 pixels has to be taken out to the outside. Furthermore, it is necessary to input the established values of skimming levels for each pixel through wiring and it is physically impossible to design that wiring.

A solution to this problem is proposed in Japanese Patent Publication Hei. 2-151183. In this device a skimming CCD for transferring the skimming voltage as a time sequence signal is arranged in parallel with the vertical CCDs for charge skimming transfer, the voltage level in proportion to the charge due to the background radiation of the respective pixel is measured, this is once stored in an external memory, and the stored signal is applied in sequence to the skimming electrodes of the respective pixels by the successive transfer by the CCD for skimming voltage transfer. However, this device requires an external memory for establishing the skimming level, a D/A converter, and an A/D converter, and a CCD for skimming voltage transfer has to be provided in parallel with the vertical CCD, thereby complicating the structure. Furthermore, because the skimming level is once stored in an external memory, it can not correspond to changes in the sensitivity of the pixel which instantaneously, occurs and it is impossible to reflect a change in sensitivity of the pixel on the skimming level in real time.

SUMMARY OF THE INVENTION

It is an object of the present invention to provide a solid-state imaging device determining the most appropriate skimming level for the respective pixels without providing an external memory and performing an effective charge skimming transfer even though the sensitivity of the pixels is non-uniform.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

In accordance with the present invention, a solid-state imaging device includes sampling circuits provided on respective pixels for detecting the quantity of charges which are produced by the photodiodes in respective pixels and outputting a voltage level in accordance therewith and a charge input section for skimming transfer of the signal charge which is produced by the photodiodes of the respective pixels, adopting the output voltage of the sampling circuit as a skimming voltage. Thus, the sampling circuit automatically detects the quantity of charge which is output by the respective pixels and the voltage according to that quantity is applied to the skimming gate electrode of the respective pixels.

DETAILED DESCRIPTION OF THE PREFERRED EMBODIMENTS

An embodiment of the present invention will be described in detail with reference to the drawings hereinbelow.

Figure 1:
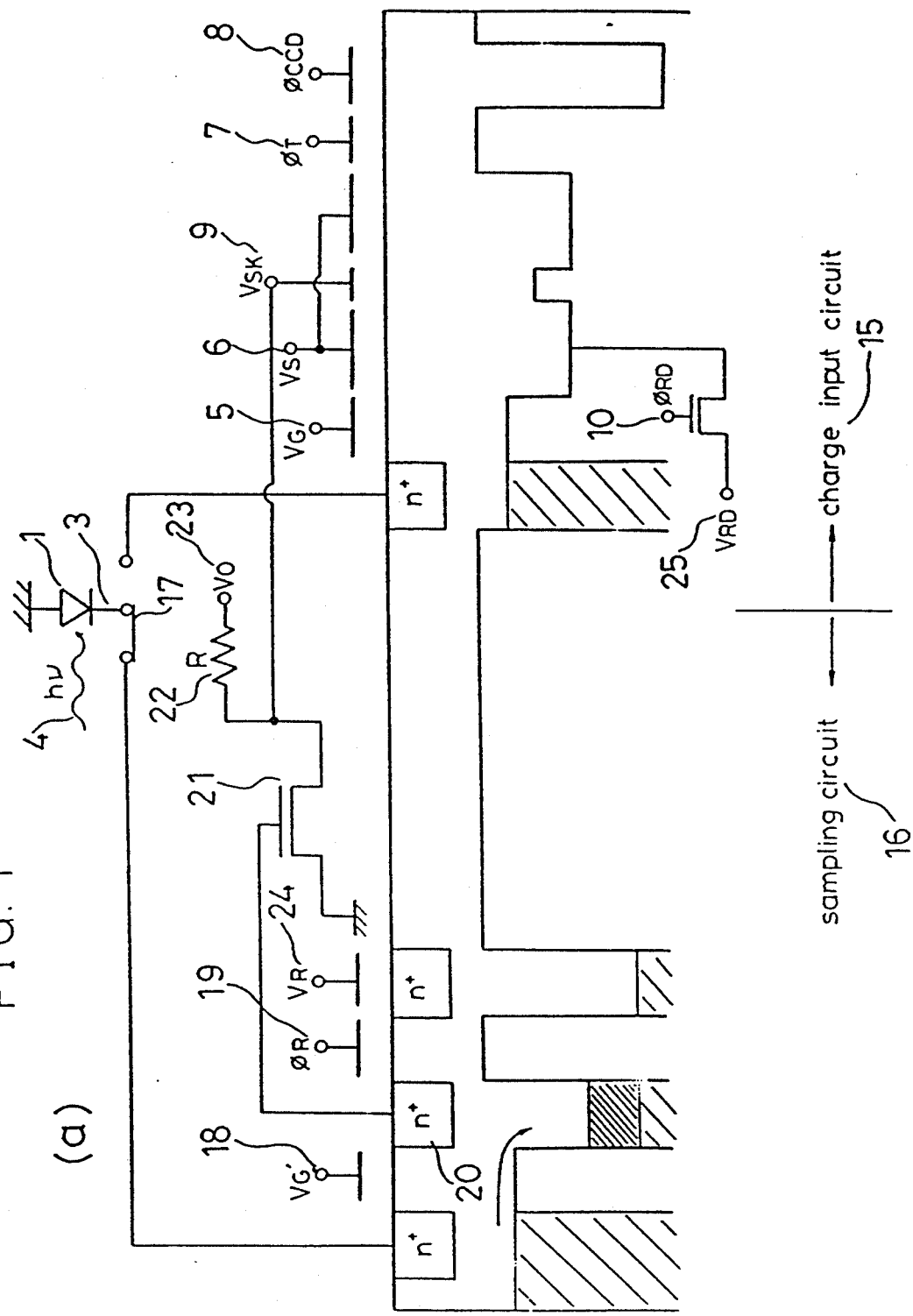
FIG. 1(a) to 1(c) are schematic diagrams showing operation of an input circuit section of a CCD of a solid-state imaging device according to an embodiment of the present invention.
Figure 6A:
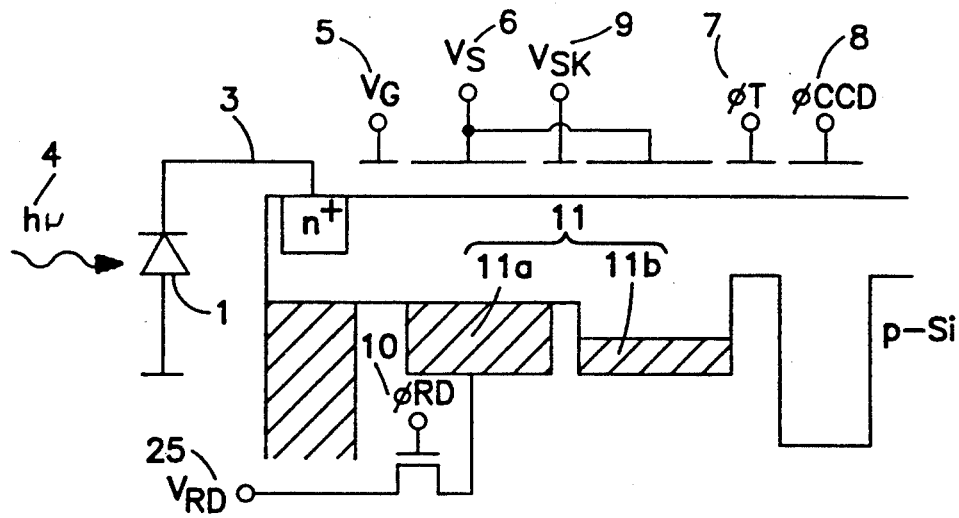
FIG. 6(a) to 6(c) are schematic diagrams showing operation of an input circuit section of a CCD according to an infrared imaging element of the prior art.
Figure 6B:
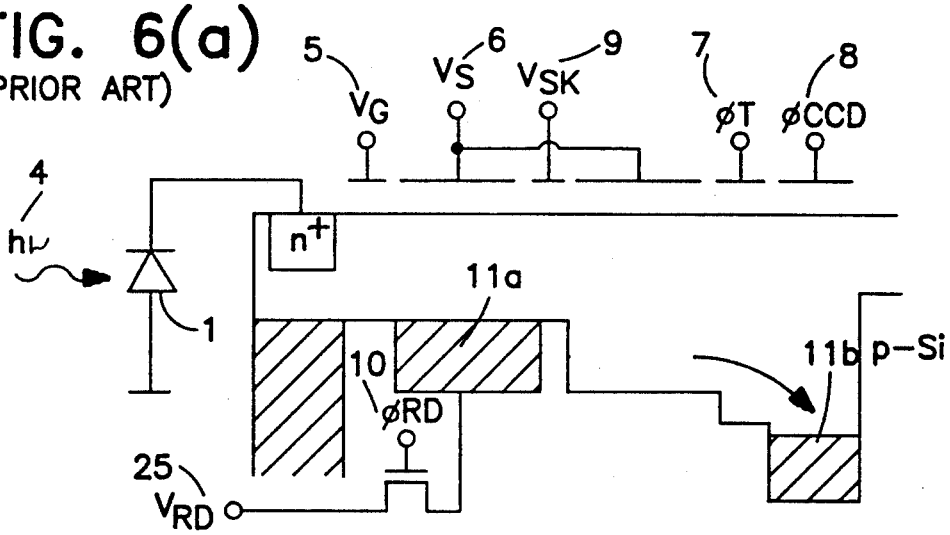
Figure 6C:
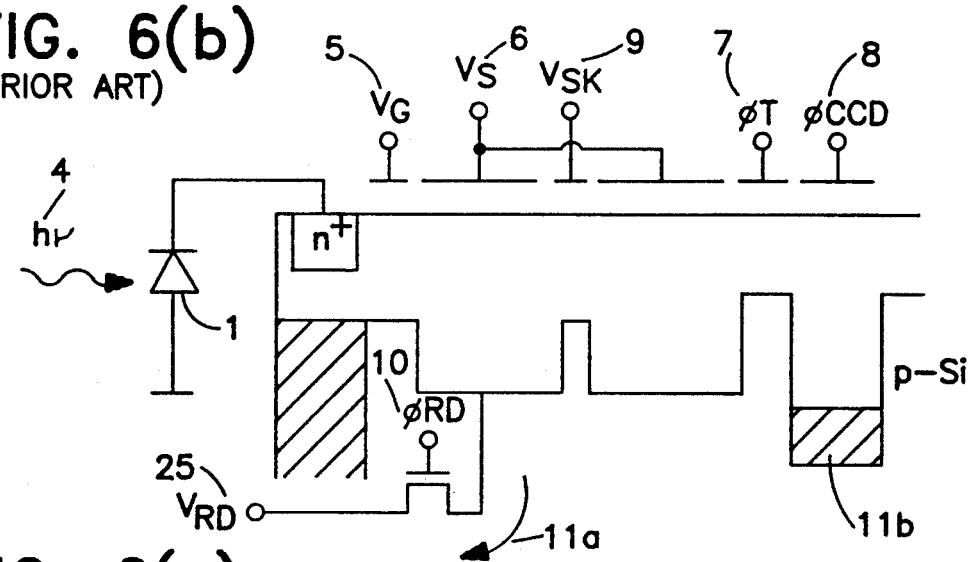
Figure 7:
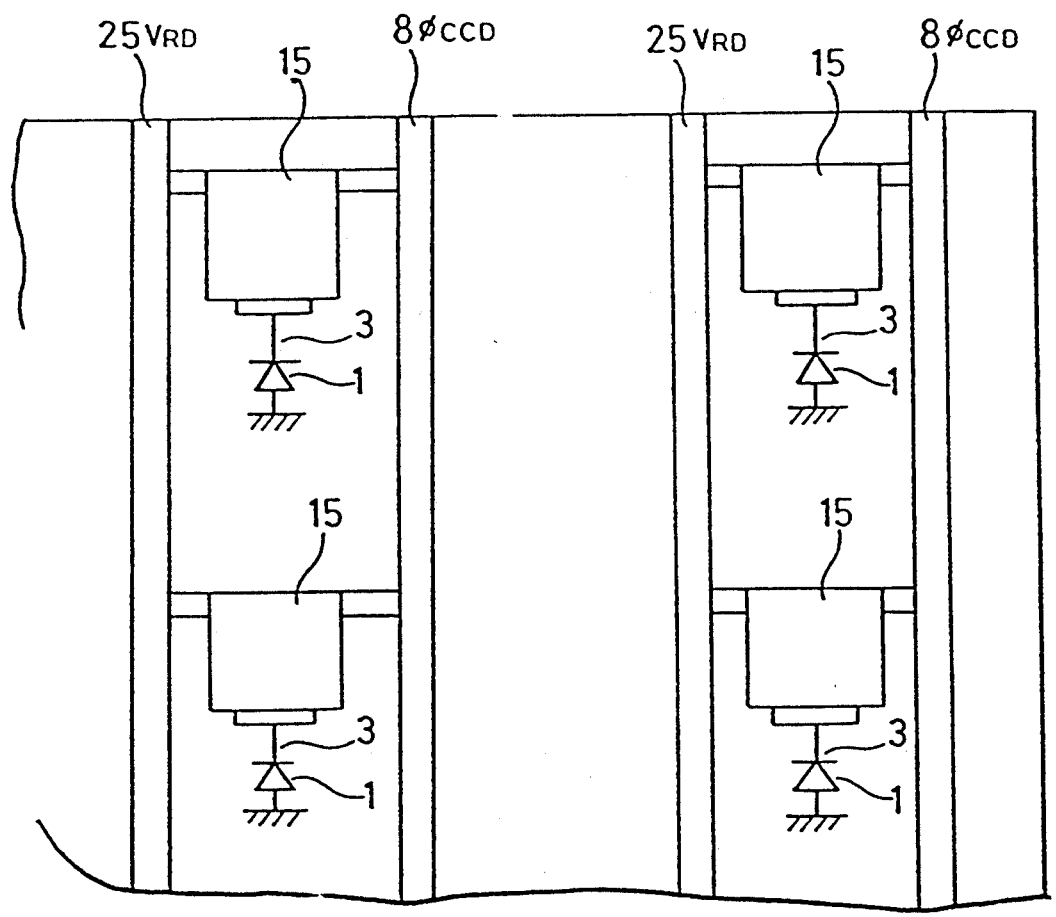
FIG. 7 is a conceptual plan view of an infrared imaging element according to the prior art.
Figure 8:
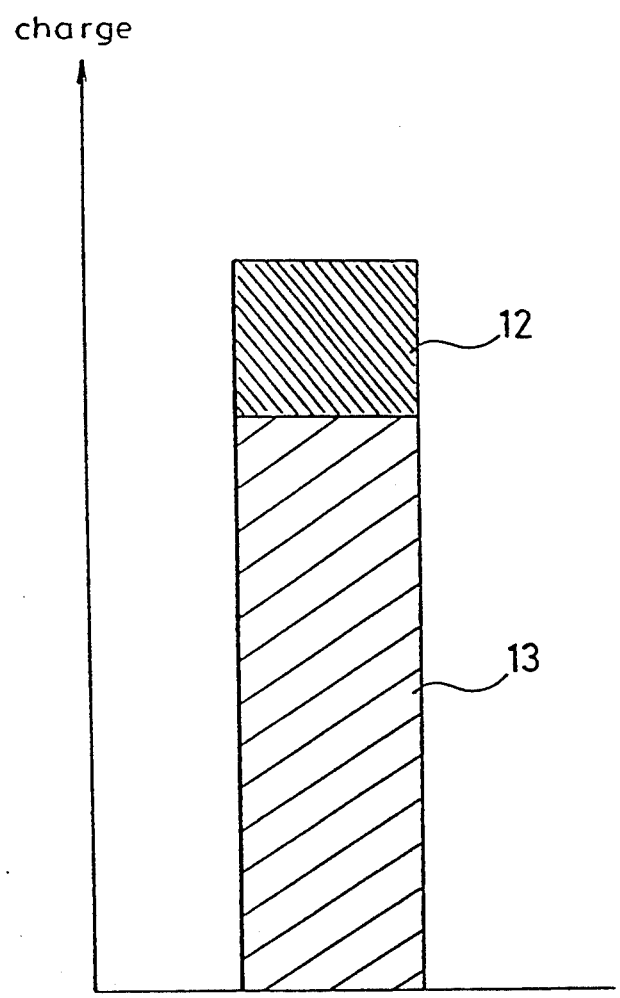
FIG. 8 is a diagram showing a stored charge in the imaging of infrared light in the 10 microns band common to both the present invention and the prior art.
Figure 9A:
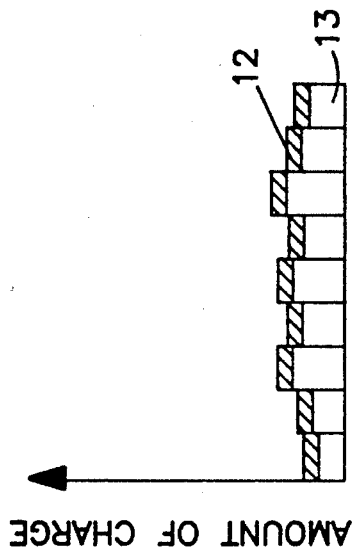
FIGS. 9(a) and 9(b) and 10(a) and 10(b) are diagrams for explaining the charge skimming transfer of an infrared imaging element according to the prior art.
Figure 10A:
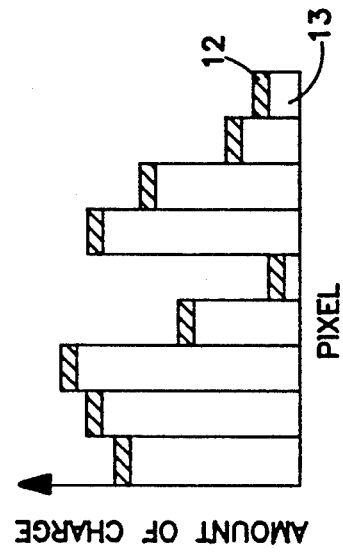
Figure 9B:
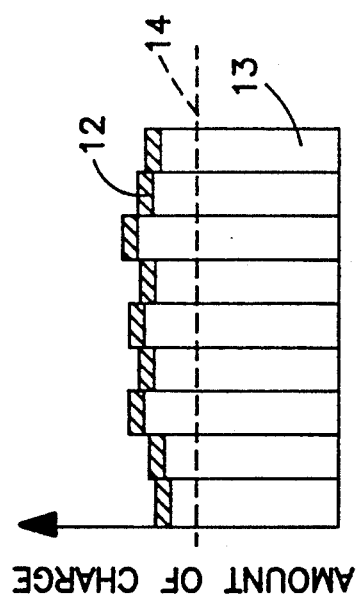
Figure 10B:
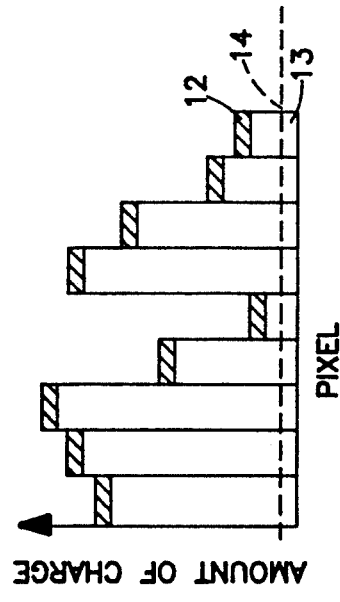

FIG. 1(a)-1(c) schematically show a solid-state imaging device in accordance with a first embodiment of the present invention, and, more particularly, operation of the input circuit of the CCD in the infrared imaging element. In those figures, the same reference numerals as those shown in FIG. 6(a) designate the same or corresponding parts. Reference numeral 1 designates a two-dimensional array of photodiodes comprising, for example 128×128 pixels. A CCD 2 produced on a silicon is provided for signal transfer. Indium bumps 3 electrically connect the two-dimensional array photodiode 1 and the signal transfer CCD 2. Reference numeral 4 designates a signal light which is incident to the two-dimensional array type photodiode 1 such as infrared light. An input gate electrode 5 is provided at the charge input section of the CCD 2. A storage gate electrode 6 is provided for storing charges input to the charge input section of the CCD. A transfer gate electrode 7 is provided for transferring charges to the charge transfer section of the CCD. A driving electrode 8 is provided to which a driving clock signal is connected for successively transferring the charge transferred from the transfer electrode perpendicular to the paper. A skimming gate electrode 9 is provided for supplying a skimming voltage for establishing the skimming level of the pixel. A charge exhaustion gate electrode 10 is provided for exhausting stored charge remaining after skimming to the charge exhaustion electrode 25. Reference numeral 15 designates a charge input circuit of the CCD. Reference numeral 16 designates a sampling circuit for detecting the quantity of charge detected by the two-dimensional array of photodiodes 1 and is produced on the same silicon substrate as the charge input circuit 15. A circuit selection switch 17 is provided for switching the input of the charge detected by the two-dimensional array photodiode 1 to the charge input circuit 15 or to the sampling circuit 16. This circuit selection switch 17 is, for example, a transistor. Reference numeral 18 designates an input gate electrode in the sampling circuit 16. Reference numeral 19 designates a gate electrode to which a reset clock signal for sampling is applied. A floating diffusion region 20 having high concentration of n-type impurities is produced in the substrate. A sampling output MOSFET 21 has a gate which is electrically connected to the floating diffusion region 20, the source thereof is connected to the ground voltage and the drain thereof is an output terminal. Reference numeral 23 is a power supply terminal of the floating diffusion amplifier (hereinafter referred to as "FDA"). One end of a resistor 22 is connected to the power supply terminal 23 and the other end thereof is connected to the output terminal of the sampling output MOSFET 21. The connection node between the output terminal of the MOSFET 21 and the resistor 22 is connected to the skimming electrode 9 of the charge input circuit 15. Reference numeral 24 designates a reset electrode of the FDA.

Hereinafter, a process of the charge skimming transfer using this infrared imaging device will be described with reference to FIGS. 1(a) to 1(c).

First of all, the switch 17 is connected to the sampling circuit 16 by a control clock signal to operate the sampling circuit 16.

Charges produced by the photodiodes in response to the incident infrared light 4 are rejected into the floating diffusion region 20 via the indium bump electrode 3 and the influence of the sampling input gate electrode 18.

The voltage level determined by the quantity of charge injected into the floating diffusion region 20 and the capacitance of the sampling output MOSFET 21 is output to the output terminal of the sampling output MOSFET 21.

Figure 3:
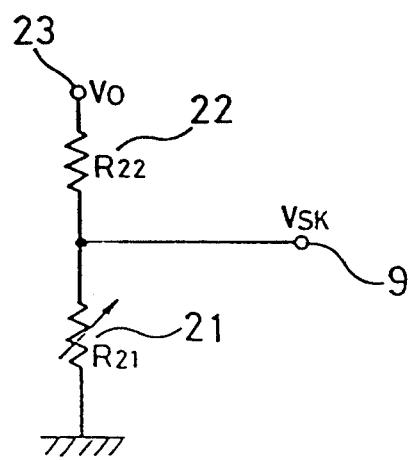
FIG. 3 is a diagram showing an equivalent circuit for establishing a skimming voltage of a sampling circuit of a solid-state imaging device according to an embodiment of the present invention.

The output terminal of the MOSFET 21 is connected to the resistor 22 which is connected to the power supply 23 of FDA and furthermore, the connection node of both is connected to the skimming gate electrode 9 in the charge input circuit 15 of respective pixel. When the internal resistance of the FET 21 is $R_{21}$, the resistance of the resistor 22 is $R_{22}$, and the power supply voltage is $V_O$, the equivalent circuit is as shown in FIG. 3 and the voltage $V_{SK}$ applied to the skimming gate electrode 9 is:

$$V_{SK} = V_o \cdot \frac{R_{21}}{R_{21} + R_{22}}$$

Therefore, as the internal resistance $R_{21}$ of the FET 21 becomes smaller, in other words, as the quantity of charge stored in the floating diffusion region 20 becomes larger, the voltage $V_{SK}$ applied to the skimming electrode 9 becomes small.

On the basis of this principle, a potential barrier according to the quantity of charge for each pixel is produced in the charge storage section in the charge input circuit of CCD (FIG. 1(a)).

Next, the switch 17 is connected to the input circuit 15 by the control clock signal. Then, the charge produced by the photodiode 1 from the light incident on the respective pixel is stored in the charge storage section below the storage gate electrode 6 via the indium bump electrode 3 and the input gate electrode 5 (FIG. 1(b)).

Then, by changing the voltage applied to the transfer gate electrode 7, only the charge 11a which is skimmed by the potential barrier in the charge storage section which is previously produced is transferred for the respective pixel. On the other hand, the charge 11b remaining in the charge storage section without being skimmed is exhausted to the charge exhaustion terminal 25 by the operation of the exhaustion gate electrode 10.

The charge 11a which is skimmed and transferred is successively transferred by the same driving method as in the prior art device and output as a time sequence signal.

Figure 2:
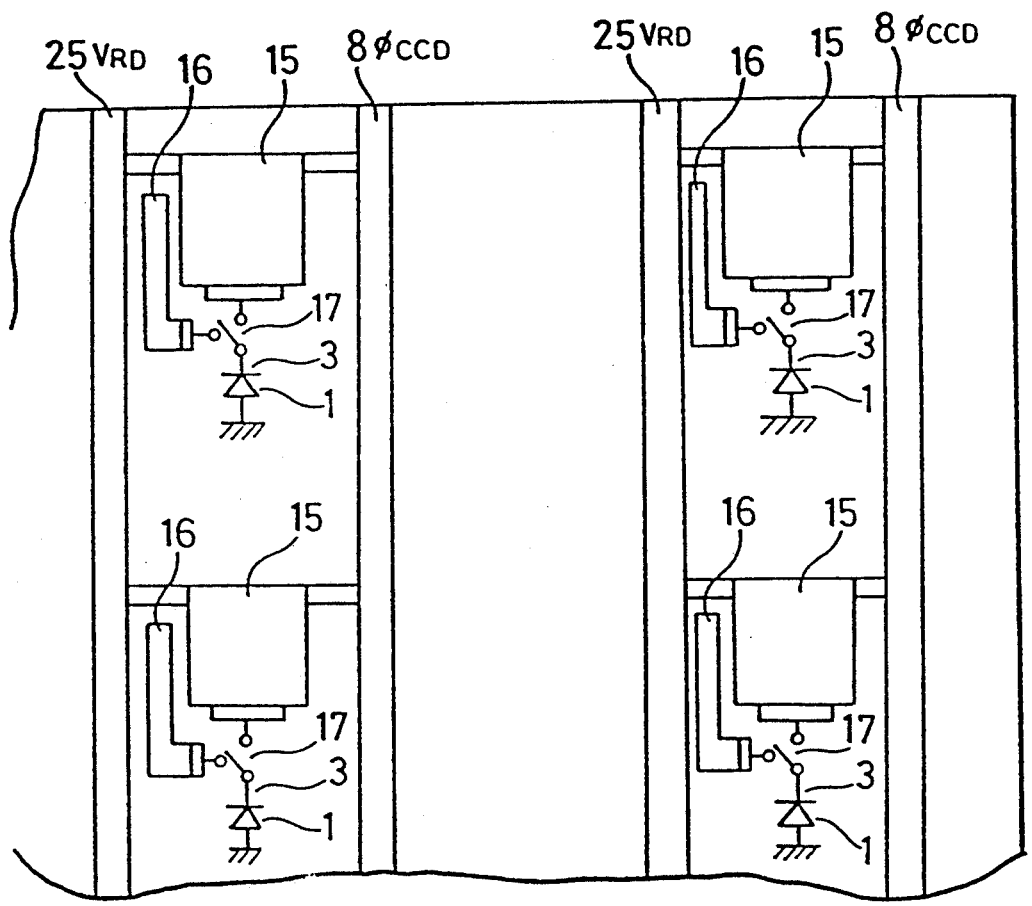
FIG. 2 is a conceptual plan view of a solid-state imaging device according to an embodiment of the present invention.

FIG. 2 shows a conceptual view in which an example of this arrangement is shown in a plane. The sampling circuit 16 is arranged on the same substrate as the charge input circuit 15 of the CCD 2 an close thereto.

Here, the circuit 16 which is used for sampling is called a floating diffusion amplifier and is widely used for converting a minute charge to a voltage.

Figure 4A:
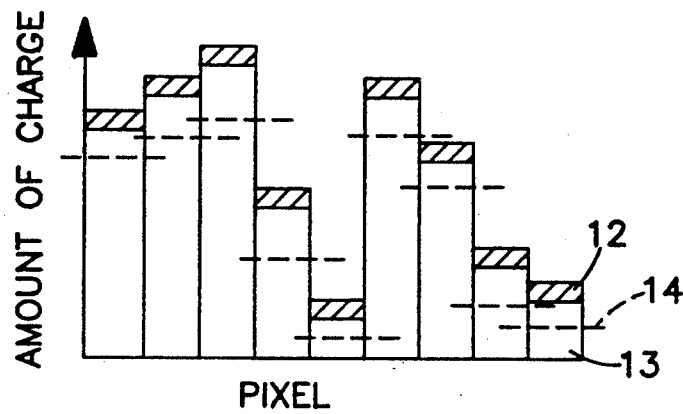
FIG. 4(a) and 4(b) are diagrams for explaining a charge skimming transfer of a solid-state imaging device according to an embodiment of the present invention.
Figure 4B:
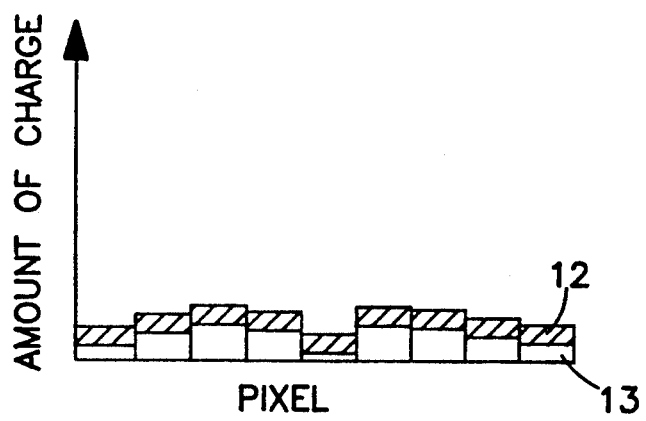
Figure 5:
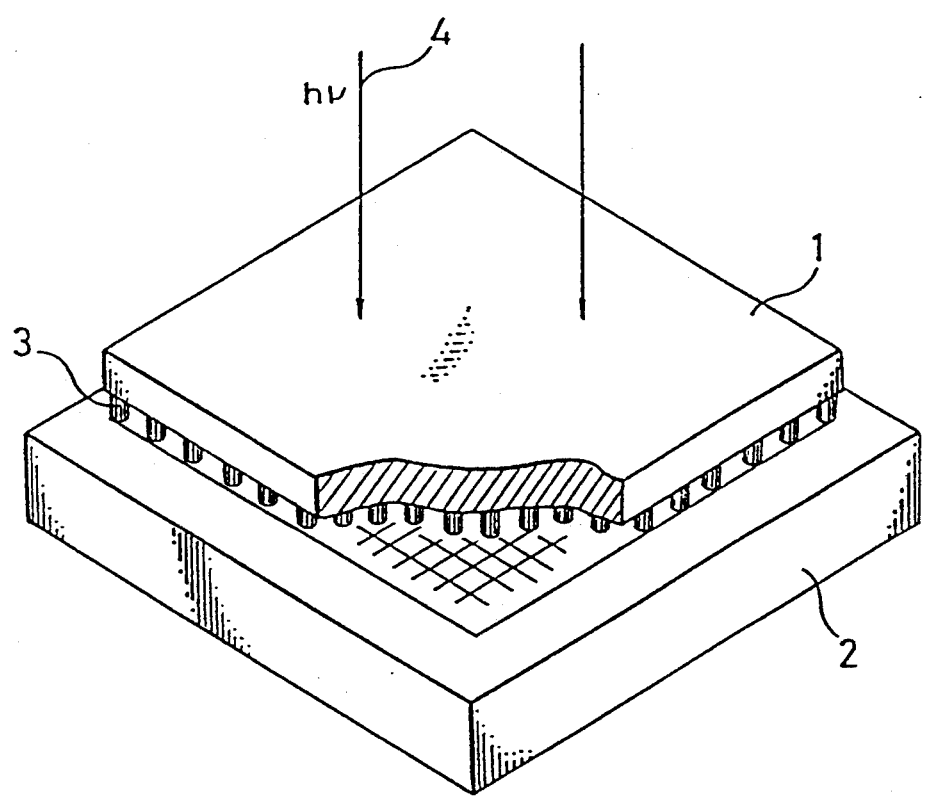
FIG. 5 is a perspective view, partially broken away of an infrared imaging element according to the prior art.

As described above, in the present embodiment, a sampling circuit 16 is provided at each charge input circuit 15 of a CCD for each pixel, the quantity of charge of the respective pixel is sampled by the sampling circuit 16, and a potential barrier in accordance with the sampled charge quantity is produced in the charge storage section of the charge input circuit 15. Therefore, as shown in FIGS. 4(a)-4(b) the optimum skimming level 14 can be automatically established at the respective pixel and even if there is non-uniformity in the sensitivity of the respective pixel, the charge 13 excited by the background radiation can be effectively removed and the charge 12 excited by the signal light can be skimming transferred effectively. As a result, even in a case where the sensitivity of the photodiode is not the same through all the pixels, a high quality picture having a high contrast can be obtained.

Furthermore, since the sampling circuit 16 is produced on the same substrate as the CCD and also close to the charge input circuit 15, the sampling circuit can be produced easily in the processing for producing the CCD without using any other special technique.

In the above illustrated embodiment, a sampling circuit 16 is provided close to the charge input circuit 15 of the CCD for each pixel. First of all, the sampling circuit is operated to automatically establish the voltage level in accordance with the quantity of charge through the FDA and this level is applied to the skimming voltage terminal 9 of the charge input circuit 15 directly as a skimming level without being stored in an external memory, thereby to establish the skimming level, and then, a skimming transfer in accordance with the skimming level is carried out by operating the charge input circuit 15. Therefore, it is possible to establish the most appropriate skimming level for each pixel without increasing the number of wires, the skimming level is established for the sensitivity of each pixel in real time, and a skimming transfer can be carried out with higher precision. In addition, the construction of this embodiment does not require external memories and is constructed on the same chip as the CCD, thereby making the element structure of small size.

In this embodiment, an infrared imaging element is described, but the present invention can be applied to other imaging elements with the same effects as described above.

While in the above illustrated embodiment a floating diffusion amplifier is used for the sampling circuit 16, any other device can be used if it can convert a minute charge to a voltage and satisfy the above described required operation.

The sampling circuit 16 is not necessarily required to be arranged on the same substrate as the charge input circuit 15, and it can be produced on a substrate other than the CCD 2 substrate.

In the above described a CCD is used for the charge transfer means, but another system also can be used.

As is evident from the foregoing description, according to the present invention, a quantity of charge is detected independently for the respective pixels and a skimming voltage in accordance therewith is obtained, thereby to produce a potential barrier which establishes the quantity of charge to be skimmingly transferred automatically. Therefore, it is possible to determine the most appropriate skimming level for each pixel in real time without increasing the number of wires, even when the sensitivity of the pixels is non-uniform, the charges due to background light can be efficiently removed and an image of quite high signal contrast and high quality obtained.

What is claimed is:

1. A solid-state imaging device utilizing a charge skimming transfer technique comprising:
   a plurality of photodiodes for converting incident light into electrical charges, each photodiode corresponding to a pixel;
   a respective sampling circuit for each pixel for detecting the charges produced by the photodiode for the corresponding pixel in response to incident background light and for outputting a voltage level in response thereto;
   a charge input circuit for each pixel for transferring charges produced by the respective photodiodes in response to incident background light and incident signal light after skimming charges produced by the background light, receiving the voltage level from the corresponding sampling circuit and utilizing the voltage level output by the respective sampling circuit as a skimming voltage to skim background charges; and
   switching means for selectively, alternatively connecting, for each pixel, the respective photodiode to the corresponding charge input circuit and the corresponding sampling circuit.

2. A solid-state imaging device as defined in claim 1 wherein said sampling circuit includes a floating diffusion amplifier.

3. A solid-state imaging device as defined in claim 1 wherein said sampling circuit and said charge input circuit are disposed on the same substrate.

4. A solid-state imaging device as defined in claim 1 wherein said charge input circuit receives as an input the quantity of charge which is produced in response to incident light and transfers the charge in excess of a skimming level.

5. A solid-state imaging device as defined in claim 1 wherein said sampling circuit includes an output terminal and said charge input circuit includes a skimming electrode, and said output terminal is electrically connected to said skimming electrode.

6. In a solid-state imaging device utilizing a charge skimming transfer technique including a plurality of photodiodes for converting incident light into electrical charges, each photodiode corresponding to a pixel; a respective sampling circuit for each pixel for detecting the charges produced by the photodiode for the corresponding pixel in response to incident background light and for outputting a voltage level in response thereto; a charge input circuit for each pixel for transferring charges produced by the respective photodiodes in response to incident background light and incident signal light after skimming charges produced by the background light, receiving the voltage level from the corresponding sampling circuit, and utilizing the voltage level output by the respective sampling circuit as a skimming voltage to skim background charges; switching means for selectively, alternatively connecting the photodiode of a pixel to the corresponding charge input circuit and the corresponding sampling circuit of the respective pixel; and a wire connecting an output terminal of the respective sampling circuits to a skimming electrode of the respective charge input circuit; an electrical driving method comprising:
   establishing a skimming voltage level of the charge input circuit by detecting the voltage levels produced by the photodiodes in response to incident background light with the sampling circuits connected to the respective photodiodes through the switching means; and
   transferring signal charges produced by the photodiodes in response to incident background light and signal light by skimming the charges in excess of the respective skimming voltage levels, the skimming voltage levels being established when the respective charge input circuits are connected to the respective photodiodes, with the respective charge input circuits connected to the corresponding photodiodes by the switching means.

* * * * *